United States Patent [19]

Sussman

[11] Patent Number: 5,318,809
[45] Date of Patent: Jun. 7, 1994

[54] APPARATUS FOR DEPOSITING A MATERIAL ON A SUBSTRATE BY CHEMICAL VAPOR DEPOSITION

[76] Inventor: Ricardo S. Sussman, 3 Frobisher Gardens, Guildford, Surrey, GU1 2NT, England

[21] Appl. No.: 972,180

[22] Filed: Nov. 4, 1992

[30] Foreign Application Priority Data

Nov. 4, 1991 [GB] United Kingdom ............... 9123331

[51] Int. Cl.⁵ .................................... C23C 16/00
[52] U.S. Cl. ................................ 427/561; 427/577; 427/585; 427/248.1; 427/249; 118/715; 118/723 HC; 118/724
[58] Field of Search ........ 118/715, 724, 723, 723 HC; 427/561, 577, 585, 248.1, 249

[56] References Cited

U.S. PATENT DOCUMENTS

| | | | |
|---|---|---|---|
| 4,953,499 | 9/1990 | Anthony | 118/724 |
| 4,970,986 | 11/1990 | Anthony | 118/724 |
| 5,007,373 | 4/1991 | Legg | 118/723 |
| 5,160,544 | 11/1992 | Garg | 118/724 |

FOREIGN PATENT DOCUMENTS 1-272758  10/1989  Japan .................................. 118/723
905696    7/1990   South Africa .

Primary Examiner—Richard Bueker
Attorney, Agent, or Firm—Scully, Scott, Murphy & Presser

[57] ABSTRACT

Apparatus for the deposition of a material such as diamond on a substrate by chemical vapor deposition is provided. The apparatus comprises:
   support shelf on which the substrate is located;
   a resistance heating element in the form of an elongate strip of conductive material having at least one curved section in its length; the elongate strip being positioned relative to, and spaced from, the substrate such that it presents an elongate edge to the substrate and an elongate edge away from the substrate; and
   means such as a perforated pipe for causing reaction gas for the deposition to pass across the elongate strip from one longitudinal edge to the other and then to the support shelf and the substrate located thereon.

23 Claims, 1 Drawing Sheet

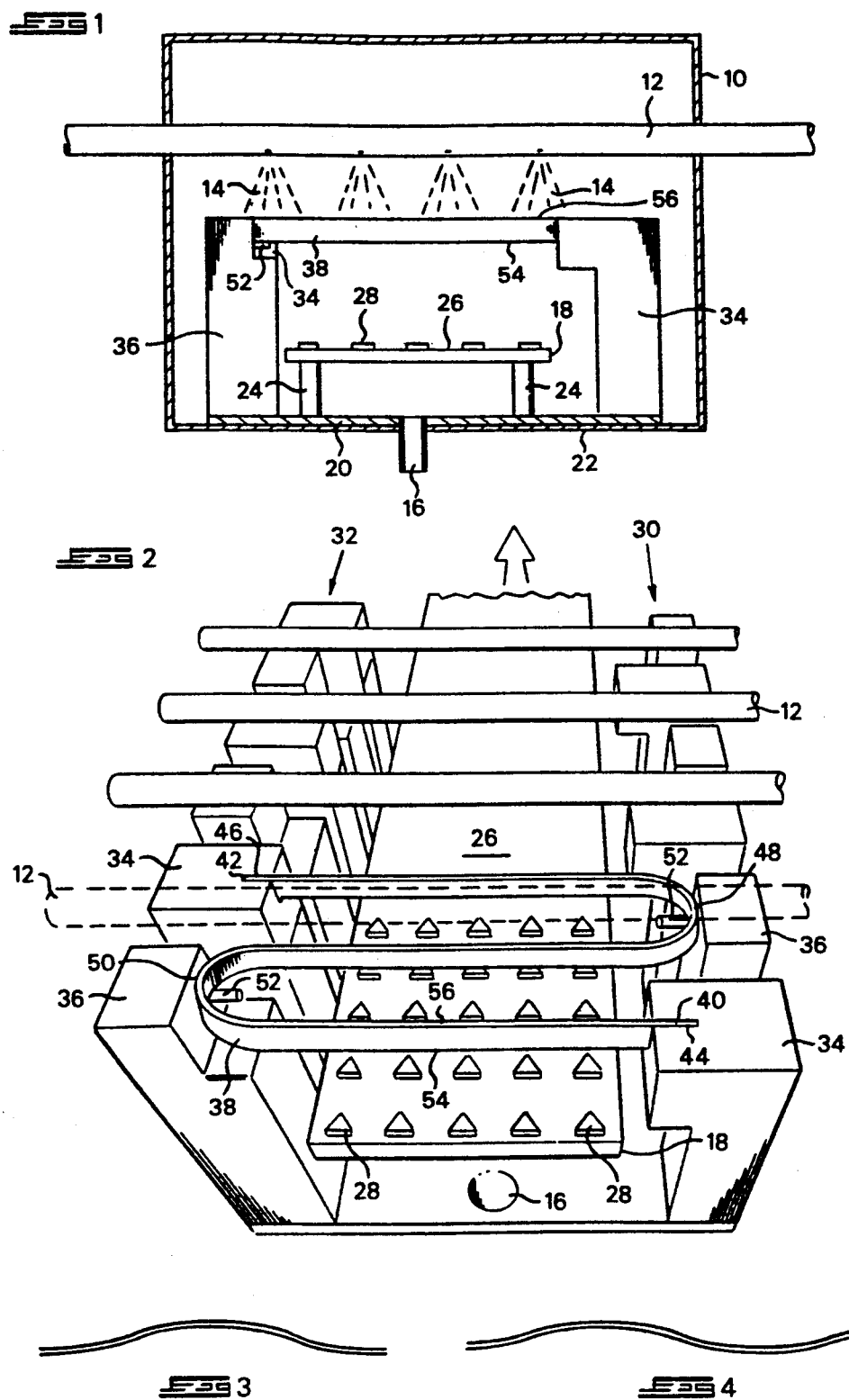

APPARATUS FOR DEPOSITING A MATERIAL ON A SUBSTRATE BY CHEMICAL VAPOR DEPOSITION

BACKGROUND OF THE INVENTION

This invention relates to apparatus for depositing a material such as diamond on a substrate by chemical vapour deposition.

Methods of depositing material such as diamond on a substrate by chemical vapour deposition (hereinafter referred to as "CVD") are now well established and have been described extensively in the patent and other literature. Where diamond is being deposited on a substrate, the method generally involves providing a mixture of hydrogen or oxygen gas and a suitable gaseous carbon compound such as a hydrocarbon, applying sufficient energy to that gas to dissociate the hydrogen into atomic hydrogen or the oxygen into atomic oxygen and the gas into active carbon ions, atoms or CH radicals and allowing such active species to deposit on the substrate to form diamond. Dissociation of the gases can take place by a variety of methods.

One such method is the use of a hot filament. In this method, the temperature of the filament is about 2000° C. and the substrate on which the diamond growth occurs is at 600° to 1100° C.

Apparatus for depositing diamond or other material on a substrate by chemical vapour deposition using the hot filament method will generally include a closed reaction chamber having at least one gas inlet and at least one exhaust means. The apparatus will further include means for supporting the substrate and resistance heating means in the form of electrically conductive filaments across which the gas is passed to cause it to dissociate. In use, the chamber will generally be maintained at a pressure below atmospheric.

One of the inherent practical problems with the hot filament deposition method is the deformation and fragility of the filament during repeated heat cycles. Various solutions to prevent filament deformation and sagging have been suggested. Most of these suggestions are based on the concept of tensioning the filaments so as to take up the expansion during heating. There are disadvantages with the tensioning technique. The filament stretches under tension at high temperatures creating thinner sections in the filament which give rise to hot spots and eventual breakage. Further, the technique requires complicated mechanical assemblies in order to tension filament wires which are then heated by high electric currents.

South African Patent No. 90/5696 provides resistance heating means in the form of a plurality of vertically extending linear, electrically conductive filaments prestressed to curve in a single plane substantially equidistant from and parallel to the substrate on which deposition is to take place. The filaments are secured at each end to a pair of electrodes.

Another frequent problem is the short life of the filaments if heat cycles are involved in the method. After being heated and exposed to the growth atmosphere most filament materials carburise and become fragile. In conventional filament holding assemblies, this will invariably result in filament breakage during the cooling cycle.

SUMMARY OF THE INVENTION

According to the present invention, apparatus for the deposition of a material on a substrate by chemical vapour deposition comprises:
   support means for the substrate;
   a resistance heating element in the form of an elongate strip of conductive material having at least one curved section in its length; the elongate strip being positioned relative to, and spaced from, the support means such that it presents an elongate edge to the support means and an elongate edge away from the support means; and means for causing reaction gas for the deposition to pass across the elongate strip from one longitudinal edge to the other and then to the support means.

Further according to the invention, a method for depositing a material on a substrate by chemical vapour deposition comprises;
   providing a substrate on support means;
   providing a resistance heating element in the form of an elongate strip of conductive material having at least one curved section in its length and elongate edges on opposite sides thereof;
   positioning the elongate strip relative to and spaced from the substrate such that it presents an elongate edge to the substrate and an elongate edge away from the substrate;
   heating the strip by passing an electric current through the strip; and causing reaction gas for the deposition to pass across the elongate strip from one longitudinal edge to the other and then to the substrate.

DESCRIPTION OF THE DRAWINGS

FIG. 1 is a sectional side view of an embodiment of the apparatus;

FIG. 2 illustrates a perspective view of a part of apparatus of FIG. 1; and

FIGS. 3 and 4 illustrate diagrammatically plan views of two further embodiments of resistance heating elements for use in the apparatus.

DESCRIPTION OF EMBODIMENTS

The elongate strip of conductive material which provides the resistance heating element has at least one curved section. This curved section may be a gentle, shallow curve or a sharp, deep one. Generally, the strip will have more than one curved section. Typically, the or each curved section will be of U-shape. In one particularly preferred form of the invention, the elongate strip has an S-shape.

The elongate strip will expand on heating and contract on cooling. To accommodate such contraction and expansion, it is preferred that the or each curved section of the strip is supported by suitable means. These means will typically comprise a support on which the or each curved section is located longitudinal edge-on. An example of suitable support means is a pin.

The strip will be thin so that the distance between the longitudinal edges is substantially greater than the thickness of the strip. The strip will typically have a parallelogram section.

The ends of the strip will generally be secured to fixed electrodes which provide the necessary electrical current for heating the strip.

The strip will generally, and preferably, not be tensioned or pre-stressed, as has been found necessary in many prior art filaments or wires.

The elongate strip will generally be made of a suitable high refractory metal such as tungsten, tantalum, rhenium, titanium or an alloy containing one or more such metals.

The reaction gas introducing means will typically be a perforated pipe which will be located on a side of the elongate strip remote from that of the substrate support means. In use, reaction gas will be caused to pass across the heated elongate strip from one longitudinal edge to the other. In so doing, components of the reaction gas will be dissociated creating the necessary active species for the deposition of the desired material on the substrate. The thus dissociated gas will pass on to a substrate located on the substrate-support means.

The resistance heating element, substrate and strip support means and reaction gas introducing means will be housed in a reaction chamber having exhaust gas means, as is known in the art. The reaction chamber will be capable of being maintained at a pressure below atmospheric because chemical vapour deposition methods are generally carried out at such pressures.

The apparatus may be used for the deposition of a variety of materials on a variety of substrates by chemical vapour deposition. In one preferred aspect of the invention, the apparatus is used for the deposition of diamond on a substrate by chemical vapour deposition. For such deposition, as is well known in the art, the strip will be heated to a temperature of the order of 2000° C. by passing an electrical current through it and the substrate on which the diamond deposition is to occur will be maintained at a temperature of the order of 600° C. to 1100° C. The reaction gas will typically contain oxygen or hydrogen, optionally an inert gas such as argon and a gaseous carbon containing compound such as a hydrocarbon or carbon monoxide.

An embodiment of the invention will now be described with reference to FIGS. 1 and 2 of the accompanying drawings. These drawings illustrate apparatus which is suitable for depositing a material such as diamond on a substrate by chemical vapour deposition. The apparatus comprises a reaction chamber 10 which is of known configuration and is capable of being maintained at a pressure below atmospheric. For clarity of illustration, the reaction chamber has been omitted from FIG. 2. Located in the chamber 10 and extending through the sides thereof are a series of perforated pipes 12 for introducing reaction gas 14 into the chamber. Exhaust gas outlets 16 are located at the lower end of the chamber 10.

A shelf-like supporting sheet 18 is located at the low point in the chamber. The sheet 18 is supported on a base 20 by posts 24. The base 20 rests on the floor 22 of the chamber 10. The exhaust gas outlets 16 pass through both the base 20 and floor 22. Located on the upper surface 26 of the sheet 18 are a plurality of substrates 28. The substrates are illustrated as having a triangular shape. The substrates may, however, have any other suitable shape.

The sheet 18 is located between opposed banks 30, 32 of alternating electrodes 34 and supporting blocks 36. The electrodes 34 and supporting blocks 36 are both made of an electrically conductive metal such as copper and are water cooled.

The apparatus includes a plurality of resistance heating elements in the form of an elongate strip 38. Only one such heating element is illustrated. The elongate strip 38 has an essentially S-shape. The ends 40, 42 of the strip are secured in slots 44, 46 in the electrodes 34 in opposite banks 30, 32. The curved sections 48, 50 of the strip rest on electrically non-conductive pins 52 secured to blocks 36 in opposite banks 30, 32.

The elongate strip 38 is so positioned in the electrodes 34 and on the support pins 52 that it presents a lower longitudinal edge 54 to the substrates 28 and an opposite longitudinal edge 56 away from the substrates 28. The edges 54 and 56 lie in parallel planes. It is further to be noted that the elongate strip is not pre-stressed or tensioned.

As mentioned, only one resistance heating element is illustrated in the drawings. The apparatus will generally contain a number of these resistance heating elements located in similar manner along the opposite banks 30, 32.

By way of example, the cross section of the elongate strip 38 is a parallelogram typically having 1 mm by 7 mm sides, i.e. a thickness of 1 mm and a distance between the longitudinal edges 54, 56 of 7 mm. The total length of the strip will typically be 100 mm.

In use, reaction gas for the deposition is introduced into the chamber 10 through the perforated inlet pipes 12. The gas passes down the chamber and across the elongate strips 38 from one longitudinal edge 56 to the other edge 54 and then on to the substrates 28. The elongate strips are heated by passing an electrical current through them. Components in the reaction gas dissociate on passage across the heated elongate strips creating active species necessary for the material deposition on the substrates.

The elongate strip resistance element used in the invention has several advantages over known resistance elements which take the form of wire filaments. First, the strip is so positioned in the reaction chamber that the narrow part or edge 54 of the strip faces the substrate, as illustrated in FIGS. 1 and 2. Thus, deformation and movement of the strip occurs in a plane parallel to that of the substrate and a constant substrate-to-filament distance is maintained. There is essentially no sagging, as occurs with prior art wire filaments. Uniform growth rate results. Second, the "S" shape of the filament provides extra degrees of freedom that allow it to deform and move when heated at high temperatures minimising high stress points and delaying eventual fracture. Third, the strip provides more surface contact area for the passing reaction gas, hence there is more efficient use of energy.

FIGS. 3 and 4 illustrate diagrammatically plan views of two alternative shapes for the filament strip. The strip of FIG. 2 has a gentle, shallow "U" section, while the strip of FIG. 3 has a shallow sine wave section.

I claim:

1. Apparatus for the deposition of a material on a substrate by chemical vapour deposition comprises:
   support means for the substrate;
   a resistance heating element in the form of an elongated strip of conductive material having at least one curved section in its length and first and second longitudinal edges, the distance between the first and second longitudinal edges being substantially greater than the thickness of the strip;
   the elongated strip being positioned relative to, and spaced from, the support means such that it presents said first longitudinal edge to the support means and said second longitudinal edge away from the support means; and means for causing a reaction gas to pass across the elongated strip from one longitudinal edge to the other and then to the support means.

2. Apparatus according to claim 1 wherein the strip has more than one curved section in its length.

3. Apparatus according to claim 1 wherein the or each curved section has a substantially U-shape.

4. Apparatus according to claim 1 wherein the strip has an S-shape.

5. Apparatus according to claim 1 wherein the or each curved section of the strip is supported by means which allow longitudinal contraction or expansion of the strip.

6. Apparatus according to claim 5 wherein said first longitudinal edge of the strip is located on the support means.

7. Apparatus according to claim 5 wherein the strip support means are pins.

8. Apparatus according to claim 1 wherein the ends of the strip are mounted in fixed electrodes.

9. Apparatus according to claim 1 wherein the strip is not pre-stressed or tensioned.

10. Apparatus according to claim 1 wherein the strip is made of a high refractory metal.

11. Apparatus according to claim 10 wherein the high refractory metal is selected from tungsten, tantalum, rhenium, titanium and alloys containing one or more of these metals.

12. Apparatus according to claim 1 wherein the reaction gas introducing means is a perforated pipe.

13. A method for depositing a material on a substrate by chemical vapour deposition comprises:
providing a substrate on support means;
providing a resistance heating element in the form of an elongated strip of conductive material having at least one curved section in its length and first and second longitudinal edges, the distance between the first and second longitudinal edges being substantially greater than the thickness of the strip on each of opposite sides thereof;
positioning the elongated strip relative to and spaced from the substrate such that it presents said first longitudinal edge to the substrate and said second longitudinal edge away from the substrate;
heating the strip by passing an electric current through the strip; and causing a reaction gas to pass across the elongated strip from one longitudinal edge to the other and then to the substrate.

14. A method according to claim 13 wherein the strip has more than one curved section in its length.

15. A method according to claim 13 wherein the or each curved section has a substantially U-shape.

16. A method according to claim 13 wherein the strip has an S-shape.

17. A method according to claim 13 wherein the or each curved section of the strip is supported by means which allow longitudinal contraction or expansion of the strip.

18. A method according to claim 17 wherein said second longitudinal edge of the strip is located on the support means.

19. A method according to claim 17 wherein the strip support means are pins.

20. A method according to claim 13 wherein the ends of the strip are mounted in fixed electrodes.

21. A method according to claim 13 wherein the strip is not pre-stressed or tensioned.

22. A method according to claim 13 wherein the strip is made of a high refractory metal.

23. A method according to claim 22 wherein the high refractory metal is selected from tungsten, tantalum, rhenium, titanium and alloys containing one or more of these metals.

* * * * *

UNITED STATES PATENT AND TRADEMARK OFFICE
CERTIFICATE OF CORRECTION

PATENT NO. : 5,318,809
DATED : June 7, 1994
INVENTOR(S) : Ricardo S. Sussmann

It is certified that error appears in the above-indentified patent and that said Letters Patent is hereby corrected as shown below:

```
        Column 6, line 22, Claim 18:   "second"
should read --first--
```

Signed and Sealed this

Twenty-seventh Day of December, 1994

Attest:

BRUCE LEHMAN

*Attesting Officer*   *Commissioner of Patents and Trademarks*